(12) United States Patent
Furumai

(10) Patent No.: US 9,397,033 B2
(45) Date of Patent: Jul. 19, 2016

(54) SEMICONDUCTOR DEVICE

(71) Applicant: Sumitomo Electric Industries, Ltd., Osaka-shi (JP)

(72) Inventor: Masaki Furumai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/724,556

(22) Filed: May 28, 2015

(65) Prior Publication Data

US 2015/0357271 A1    Dec. 10, 2015

(30) Foreign Application Priority Data

Jun. 6, 2014    (JP) .................................. 2014-117862

(51) Int. Cl.
*H01L 23/495*    (2006.01)
*H01L 23/498*    (2006.01)
(Continued)

(52) U.S. Cl.
CPC ........ *H01L 23/49811* (2013.01); *H01L 23/047* (2013.01); *H01L 23/3107* (2013.01); *H01L 23/3135* (2013.01); *H01L 23/3157* (2013.01); *H01L 23/3675* (2013.01); *H01L 23/3677* (2013.01); *H01L 23/4334* (2013.01); *H01L 23/49562* (2013.01); *H01L 24/06* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/04026* (2013.01); *H01L 2224/04042* (2013.01); *H01L 2224/0603* (2013.01); *H01L 2224/06181* (2013.01); *H01L 2224/291* (2013.01); *H01L 2224/2929* (2013.01); *H01L 2224/29116* (2013.01); *H01L 2224/29339* (2013.01); *H01L 2224/32225* (2013.01);
(Continued)

(58) Field of Classification Search
CPC .............. H01L 23/047; H01L 23/3157; H01L 23/3675
USPC ........................... 257/784, 787, 666, E23.031
See application file for complete search history.

(56) References Cited

U.S. PATENT DOCUMENTS 6,433,420 B1 * 8/2002 Yang ..................... H01L 21/565
                                                                257/667
6,720,647 B2 * 4/2004 Fukuizumi .......... H01L 23/3672
                                                                257/698

(Continued)

FOREIGN PATENT DOCUMENTS

JP    2698259 B2    1/1998
JP    2795961 B2    9/1998

*Primary Examiner* — Nitin Parekh
(74) *Attorney, Agent, or Firm* — Venable LLP; Michael A. Sartori; Laura G. Remus

(57) ABSTRACT

The semiconductor device in accordance with one mode comprises a semiconductor chip; a chip mounting substrate on which the semiconductor chip is mounted; a chip container that is provided on the chip mounting substrate and contains the semiconductor chip; and a seal part that seals the chip container containing the semiconductor chip and the chip mounting substrate. The chip container has a frame part surrounding a periphery of the semiconductor chip. The height of the frame part is greater than that of the semiconductor chip. The inside of the frame part in the chip container is provided with a chip coating material that protects the semiconductor chip.

9 Claims, 5 Drawing Sheets

(51) Int. Cl.
*H01L 23/047* (2006.01)
*H01L 23/31* (2006.01)
*H01L 23/367* (2006.01)
*H01L 23/433* (2006.01)
*H01L 23/00* (2006.01)

(52) U.S. Cl.
CPC ............... *H01L 2224/32245* (2013.01); *H01L 2224/45014* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/49171* (2013.01); *H01L 2224/73265* (2013.01); *H01L 2224/8592* (2013.01); *H01L 2924/1033* (2013.01); *H01L 2924/10253* (2013.01); *H01L 2924/10254* (2013.01); *H01L 2924/10272* (2013.01); *H01L 2924/12032* (2013.01); *H01L 2924/13055* (2013.01); *H01L 2924/13091* (2013.01); *H01L 2924/181* (2013.01)

(56) References Cited

U.S. PATENT DOCUMENTS

| | | | | |
|---|---|---|---|---|
| 6,882,041 | B1* | 4/2005 | Cheah | H01L 21/54 257/667 |
| 7,119,447 | B2* | 10/2006 | Larking | H01L 23/3107 257/666 |
| 8,072,047 | B2* | 12/2011 | Camacho | H01L 23/3107 174/50.59 |
| 8,723,304 | B2* | 5/2014 | Kang | H01L 23/4952 257/666 |
| 2001/0048116 | A1* | 12/2001 | Standing | H01L 23/3107 257/177 |
| 2002/0063326 | A1* | 5/2002 | Nakashima | H01L 21/565 257/704 |
| 2007/0090543 | A1* | 4/2007 | Condie | H01L 23/3164 257/787 |
| 2009/0230487 | A1* | 9/2009 | Saitoh | B81B 7/0061 257/419 |
| 2009/0289335 | A1* | 11/2009 | Camacho | H01L 23/3107 257/659 |
| 2009/0294930 | A1* | 12/2009 | Yoon | H01L 23/552 257/660 |

\* cited by examiner

SEMICONDUCTOR DEVICE

TECHNICAL FIELD

The present invention relates to a semiconductor device.

BACKGROUND

Known as a semiconductor device is one in which a semiconductor chip is mounted on a metal piece (chip mounting substrate) having good thermal conductivity and sealed with a resin as disclosed in Patent Literature 1 (Japanese Patent Publication No. 2795961). In the technique disclosed in Patent Literature 1, the semiconductor chip is covered with a chip coating material for its protection.

SUMMARY

For covering a semiconductor chip with a chip coating material, it is considered typical to subject the semiconductor chip to potting (resin potting) with the chip coating material and then cure the chip coating material.

However, the form of the potted resin depends on the surface tension of the chip coating material until the chip coating material cures. Therefore, immediately after being potted on the semiconductor chip, the chip coating material covers the semiconductor chip, but it may spread (or collapse) before curing. As a result, a part of the semiconductor chip, in particular, an edge of the semiconductor chip on the side opposite from the metal piece (chip mounting substrate) mounted with the semiconductor chip, may be exposed from the chip coating material. In this case, the chip coating material cannot fully protect the semiconductor chip, thereby lowering the durability of the semiconductor device.

The semiconductor device in accordance with one aspect of the present invention comprises a semiconductor chip; a chip mounting substrate on which the semiconductor chip is mounted; a chip container that is provided on the chip mounting substrate and contains the semiconductor chip; and a seal part that seals the chip container containing the semiconductor chip and the chip mounting substrate. The chip container has a frame part surrounding a periphery of the semiconductor chip. A height of the frame part is greater than that of the semiconductor chip. The inside of the frame part in the chip container is provided with a chip coating material that protects the semiconductor chip.

DETAILED DESCRIPTION

Description of Embodiments of the Invention

Figure 1:
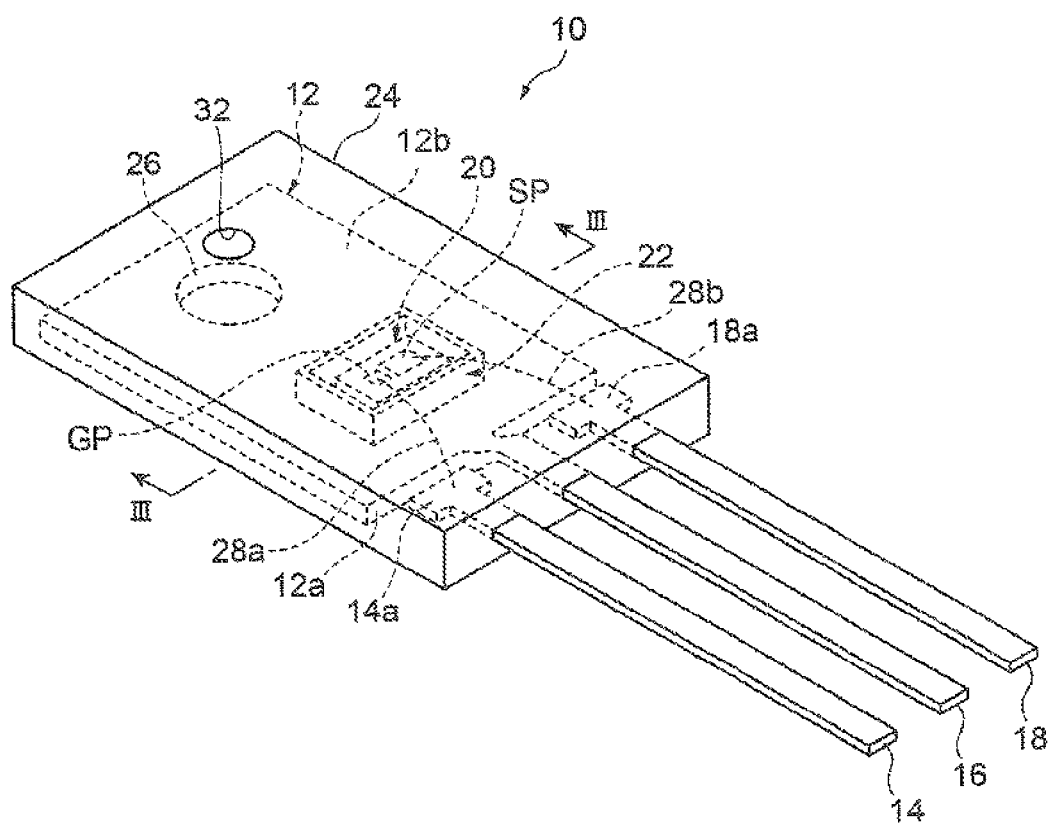
FIG. 1 is a perspective view of the semiconductor device in accordance with one mode.

First, contents of embodiments of the present invention will be listed and explained. (1) The semiconductor device in accordance with one mode comprises a semiconductor chip; a chip mounting substrate on which the semiconductor chip is mounted; a chip container that is provided on the chip mounting substrate and contains the semiconductor chip; and a seal part that seals the chip container containing the semiconductor chip and the chip mounting substrate. The chip container has a frame part surrounding a periphery of the semiconductor chip. A height of the frame part is greater than that of the semiconductor chip. The inside of the frame part in the chip container is provided with a chip coating material that protects the semiconductor chip.

In the above-mentioned semiconductor device, the semiconductor chip is contained in the chip container, while the inside of the frame part in the chip container is provided with the chip coating material. Therefore, the region provided with the chip coating material is defined by the frame part. The height of the frame part is greater than that of the semiconductor chip. As a result, the chip coating material can reliably cover the semiconductor chip, thereby protecting the semiconductor chip more securely.

(2) In one mode, the chip container may be the frame part. This enables the chip coating material to protect the semiconductor chip more securely in a simple structure.

(3) In one mode, the chip container may have a seat part that is secured onto the chip mounting substrate and on which the semiconductor chip is mounted and the frame part disposed on the seat part. This mode makes it possible to manufacture the semiconductor device by mounting the chip container containing the semiconductor chip onto the chip mounting substrate, for example. Therefore, the semiconductor device is easier to manufacture.

(4) In one mode, the seat part may be a heat radiation plate. In this mode, the fact that the seat part is a heat radiation plate improves the heat dissipation of the semiconductor chip during its operation.

(5) One mode may further comprise a first lead integrally joined to the chip mounting substrate and electrically connected to the semiconductor chip and a second lead distanced from the chip mounting substrate but secured to the chip mounting substrate by the seal part and electrically connected to the semiconductor chip. This mode can drive the semiconductor chip through the first and second leads.

DETAILS OF EMBODIMENTS OF THE INVENTION

In the following, specific examples of the semiconductor devices in accordance with the embodiments of the present invention will be explained with reference to the drawings. The present invention is not limited to these illustrations but is indicated by the claims and intends to include all the changes within the spirit and scope equivalent to the claims. In the explanation of the drawings, the same constituents will be referred to with the same signs while omitting their overlapping descriptions. Ratios of dimensions in the drawings do not always correspond to those explained.

First Embodiment

Figure 2A:
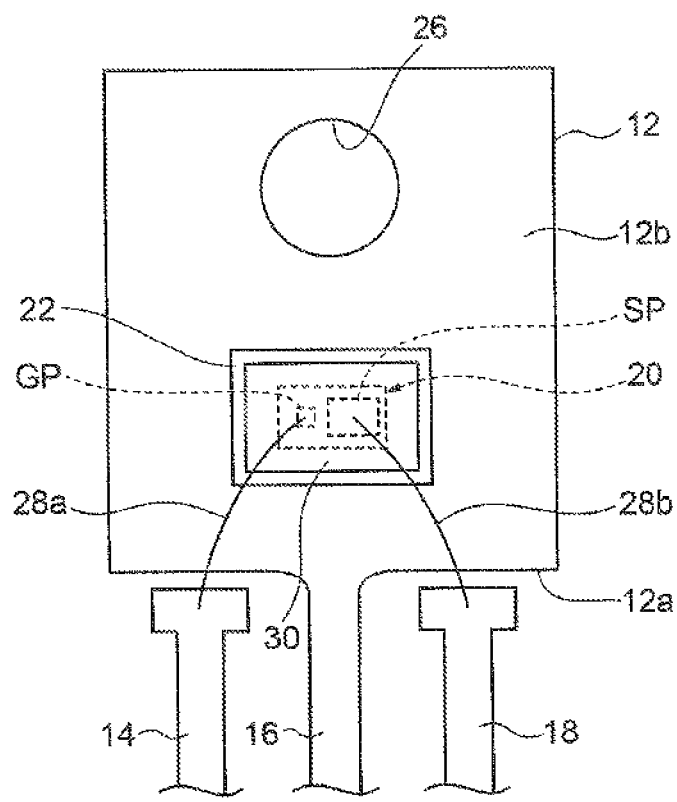
FIG. 2A is a plan view illustrating the semiconductor device of FIG. 1 without its seal part.
Figure 2B:
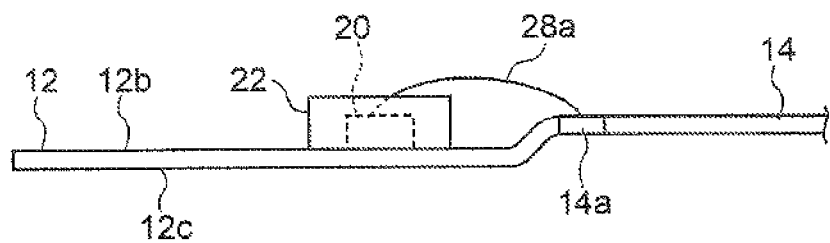
FIG. 2B is a side view illustrating the semiconductor device of FIG. 1 without its seal part.
Figure 3:
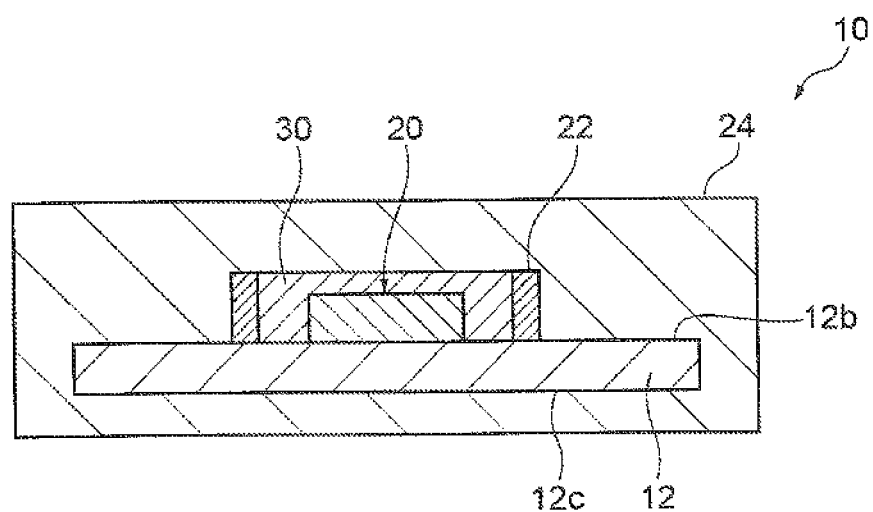
FIG. 3 is a cross-sectional view taken along the line III-III of FIG. 1.

The semiconductor device in accordance with one embodiment will be explained with reference to FIGS. 1 to 3. FIG. 1 is a perspective view of the semiconductor device in accordance with one embodiment. FIG. 2A is a plan view of the semiconductor device illustrated in FIG. 1. FIG. 2B is a side view of the semiconductor device illustrated in FIG. 1. FIGS. 2A and 2B omit a seal part illustrated in FIG. 1. FIG. 3 is a cross-sectional view taken along the line III-III of FIG. 1.

As illustrated in FIGS. 1, 2A, and 2B, the semiconductor device 10 is a resin-sealed semiconductor device comprising a die pad (chip mounting substrate) 12, three leads 14, 16, 18, a semiconductor chip 20, a frame part (chip container) 22, and a seal part 24.

The die pad 12 has a plate form and is electrically conductive. The die pad 12 has a rectangular form in planar view, for example. Examples of materials constituting the die pad 12 include copper and copper alloys. When thus constituted by a metal, the die pad 12 is a metal piece (or metal tab). In one mode, the die pad 12 may be formed with a through hole 26 penetrating therethrough in the thickness direction of the plate. The through hole 26 is a hole for passing a screw therethrough when securing the semiconductor device 10 to other members and the like by screwing, for example.

The three leads 14, 16, 18 function as electrode terminals for connecting the semiconductor chip 20 to the outside and constitute a lead frame together with the die pad 12. One lead (first lead) 16 in the three leads 14, 16, 18 is mechanically (or physically) joined integrally to a side face 12a of the die pad 12. Since the die pad 12 is electrically conductive, the lead 16 and die pad 12 are electrically connected to each other. Examples of materials for the lead 16 include those for the die pad 12. The die pad 12 having the lead 16 joined thereto is only required to be made such that the lead 16 mechanically joins directly with the die pad 12 and can be made by integrally shaping an electrically conductive plate material such as a metal plate by pressing, for example.

The remaining two leads (second leads) 14, 18 in the leads 14, 16, 18 are distanced from the side face 12a of the die pad 12 but secured to the die pad 12 by the seal part 24. Examples of materials for the leads 14, 18 include copper and copper alloys.

The semiconductor chip 20 is a semiconductor element mounted on a front face 12b of the die pad 12. Examples of the semiconductor chip 20 include transistors such as MOS-FET and insulated gate bipolar transistors (IGBT) and diodes such as p-n junction diodes and Schottky barrier diodes. Examples of materials for the semiconductor chip 20 include wide-bandgap semiconductors, and other semiconductors such as silicon. The wide-bandgap semiconductors have a bandgap greater than that of silicon. Examples of the wide-bandgap semiconductors include silicon carbide (SiC), gallium nitride (GaN), and diamond.

In the following, the semiconductor chip 20 will be explained as a MOS-FET for convenience.

The semiconductor chip 20, which is a MOS-FET, may have electrode pads GP, SP electrically connected to gate and source electrodes, respectively, on its front face (a surface on the side opposite from the front face 12b of the die pad 12) side. The electrode pad GP is electrically connected to the lead 14 through a conductor line 28a. The electrode pad SP is electrically connected to the lead 18 through a conductor line 28b. Examples of the conductor lines 28a, 28b include aluminum wires, aluminum ribbons, gold wires, gold ribbons, and copper wires. An electrode pad electrically connected to a drain electrode may be formed on the whole rear face of the semiconductor chip 20.

The semiconductor chip 20 may be mounted on the front face 12b by being bonded thereto with leaded metal solder, lead-free metal solder, or an electrically conductive adhesive such as a silver paste or an electrically conductive resin. When the electrode pad is formed on the rear face (the surface on the front face 12b side) of the semiconductor chip 20, bonding the semiconductor chip 20 to the front face 12b with the solder or electrically conductive adhesive as mentioned above electrically connects the semiconductor chip 20 to the die pad 12 and, as a result, to the lead 16.

The frame part 22 is a frame secured to the front face 12b so as to surround the periphery of the semiconductor chip 20. In other words, the semiconductor chip 20 is contained in the frame part 22. In planar view (when seen in the thickness direction of the semiconductor chip 20), the frame part 22 may have a quadrangular form as illustrated in FIG. 2A or a circular form as long as it is formed like a ring. The height of the frame part 22 (the length in the direction normal to the front face 12b) is greater than the height (or thickness) of the semiconductor chip 20 as illustrated in FIGS. 2B and 3. In one mode, the frame part 22 may have such a height that it does not come into contact with the conductor lines 28a, 28b, i.e., a height lower than that of the highest point in loops of the conductor lines 28a, 28b. Examples of materials for the frame part 22 are not limited in particular but include metals, ceramics, and resins.

The frame part 22 made of a metal may be firmly fixed to the die pad 12 with the same solder, silver paste, or adhesive used for firmly fixing the semiconductor chip 20 to the die pad 12. The frame part 22 made of a ceramic or resin may be firmly fixed to the die pad 12 with an adhesive.

As illustrated in FIG. 3, the inside of the frame part 22 is provided with a chip coating material 30 for protecting the semiconductor chip 20, so that the semiconductor chip 20 is buried in the chip coating material 30. Specifically, a chip coating material 30 is injected into the inside of the frame part 22, so that the semiconductor chip 20 is buried in the chip coating material 30. Hereinafter, the region provided with the chip coating material 30 refers to the region injected with the chip coating material 30. In one mode, as illustrated in FIG. 3, it is sufficient for the inside of the frame part 22 to be filled with the chip coating material 30, while the chip coating material 30 is only required to be provided such that the semiconductor chip 20 is buried therewith. That is, the height of the region injected with the chip coating material 30 may be lower than that of the frame part 22, as long as it is higher than that of the semiconductor chip 20.

Examples of materials for the chip coating material 30 include epoxy-based resins (specific examples of which include epoxy resins), polyimide resins, polyimide-based silicone resins (specific examples of which include polyimide silicone resins), and silicone resins. In one mode, the chip coating material 30 is made of a moisture-resistant resin, i.e., a resin having low water absorption. By moisture-resistant (or low water absorption) is meant that the water absorption is 1% or less. Examples of the moisture-resistant resins include the above-mentioned epoxy-based resins.

The seal part 24 seals the die pad 12 and the frame part 22 containing the semiconductor chip 20. As illustrated in FIG. 1, the leads 14, 18 have respective one ends 14a, 18a located within the seal part 24 and secured to the die pad 12 through the seal part 24. In the leads 14, 16, 18, the parts on the inside and outside of the seal part 24 are so-called inner and outer leads, respectively.

As illustrated in FIG. 1, an example of outer forms of the seal part 24 is a rectangular parallelepiped. The seal part 24 is made of a resin, examples of which include thermosetting resins. Examples of the thermosetting resins include epoxy-based resins. Other examples of the seal part 24 include phenolic resins. The seal part 24 may be formed by molding the die pad 12 and the frame part 22 containing the semiconductor chip 20 with a resin to become the seal part 24.

The seal part 24 may cover a rear face 12c of the die pad 12 as illustrated in FIG. 3 or seal the die pad 12 and the like so as to expose the rear face 12c. In one mode, the seal part 24 may be formed with a through hole 32 (see FIG. 1) whose center axis coincides with that of the through hole 26 of the die pad 12. As with the through hole 26, the through hole 32 is a hole through which a screw passes when screwing and so forth. The through hole 32 has a diameter smaller than that of the through hole 26.

The semiconductor device 10 may be manufactured as follows, for example. First, the die pad 12 having the lead 16 integrally joined thereto is prepared, and the semiconductor chip 20 is mounted on the front face 12b with solder and the like.

The frame part 22 is firmly fixed to the front face 12b such that the semiconductor chip 20 is contained inside. The frame part 22 made of a metal may be firmly fixed to the front face 12b with the same solder used when firmly fixing the semiconductor chip 20 to the front face 12b or with a silver paste or adhesive after mounting the semiconductor chip onto the front face 12b. The frame part 22 made of a resin may be firmly fixed to the front face 12b with an adhesive after mounting the semiconductor chip 20 onto the front face 12b.

After surrounding the semiconductor chip 20 with the frame part 22, the semiconductor chip 20 is electrically connected to the leads 14, 18 with the conductor lines 28a, 28b.

Thereafter, the chip coating material 30 is injected into the inside of the frame part 22, so as to cover the semiconductor chip 20. Subsequently, the chip coating material 30 is cured by a method (such as heating or ultraviolet irradiation, for example) corresponding to the properties of the chip coating material 30.

Next, the die pad 12 and frame part 22 are sealed with the seal part 24, so as to yield the semiconductor device 10. The seal part 24 may be formed by molding the die pad 12 and the frame part 22 containing the semiconductor chip 20 and having the chip coating material 30 injected therein with a resin for the seal part 24 (hereinafter referred to as sealing resin), for example. At the time of molding, the die pad 12 and the like are molded with the sealing resin such that the respective one ends of the leads 16, 18 are located within the seal part 24. Examples of the sealing resin include epoxy-based resins and phenolic resins.

In the semiconductor device 10, the semiconductor chip 20 sealed with the seal part 24 and buried in the chip coating material 30 is electrically connected to the leads 14, 16, 18. This makes it possible to supply power to the semiconductor chip 20 and input/output signals to/from the semiconductor chip 20 as appropriate through the leads 14, 16, 18. That is, the semiconductor chip 20 can be driven through the leads 14, 16, 18, so as to enable the semiconductor device 10 to operate.

The semiconductor device 10 has the frame part 22 surrounding the semiconductor chip 20 at its periphery, while the chip coating material 30 is injected into the inside of the frame part 22. In other words, the region injected with the chip coating material 30 is defined by the frame part 22. Therefore, the semiconductor chip 20 is securely coated with the chip coating material 30, which improves the durability of the semiconductor chip 20 and consequently the durability of the semiconductor device 10. This point will be explained in comparison with a case in which the frame part 22 is not provided.

When the frame part 22 is not provided, the following method may be considered for covering the semiconductor chip 20 with the chip coating material 30, for example. That is, after mounting the semiconductor chip 20 on the front face 12b, the chip coating material 30 is potted on the semiconductor chip 20. Then, the potted chip coating material 30 is cured. Immediately after being potted on the semiconductor chip 20, the chip coating material 30 covers the semiconductor chip 20, but it may spread before curing. And as a result, a part of the semiconductor chip 20, in particular, an edge of the semiconductor chip 20 on the front face side, may be exposed from the chip coating material 30. This is because the potted form of the chip coating material 30 before curing depends on the surface tension of the chip coating material 30.

When the frame part 22 is provided at the periphery of the semiconductor chip 20 as in the semiconductor device 10, by contrast, the region injected with the chip coating material 30 is defined by the frame part 22. In other words, the frame part 22 functions as a dam against the chip coating material 30. When the chip coating material 30 is injected into the inside of the frame part 22 in order to cover the semiconductor chip 20 in this case, the form of the injection region does not substantially depend on the surface tension of the chip coating material 30. Therefore, even after curing the chip coating material 30, the semiconductor chip 20 as a whole can securely be covered with the chip coating material 30, whereby the semiconductor chip 20 can be protected by the chip coating material 30. This improves the durability of the semiconductor chip 20 and, as a result, the durability of the semiconductor device 10.

Specifically, providing the frame part 22 enables the chip coating material 30 to protect the semiconductor chip 20 securely, so as to mitigate stresses acting on the semiconductor chip 20 at the time of molding or prevent cracks from being caused by heat cycles generated by pulsed operations of the semiconductor chip 20 (repeated ON/OFF states of the semiconductor chip 20), for example. When the semiconductor chip 20 is a wide-bandgap semiconductor including SiC or GaN in particular, the semiconductor device 10 tends to be used for power devices and the like. While the above-mentioned heat cycles of the semiconductor chip 20 yield such a large temperature difference that cracks are more likely to occur in this case, the semiconductor chip 20 is protected by the chip coating material 30 as mentioned above, whereby the cracks and the like can be suppressed more. This improves the durability of the semiconductor chip 20 and, as a result, the durability of the semiconductor device 10.

Since the semiconductor chip 20 can be coated completely and is not exposed from the chip coating material 30, moisture and the like are hard to infiltrate the semiconductor chip 20 when the chip coating material 30 is moisture-resistant. As a result, cracks and damages of the semiconductor chip 20 caused by moisture are reduced more securely. Since the infiltration of moisture into the semiconductor chip 20 is likely to occur along the interface between the chip coating material 30 and semiconductor chip 20 in particular, it is important for the semiconductor chip 20 to be covered completely with the chip coating material 30 in order to prevent moisture from infiltrating the semiconductor chip 20. Therefore, the structure of the semiconductor device 10 that can completely cover the semiconductor chip 20 with the chip coating material 30 by providing the frame part 22 is effective from the viewpoint of preventing moisture and the like from infiltrating the semiconductor chip 20. When the chip coating material 30 is moisture-resistant, the level of moisture resistance required for the seal part 24 can be lowered, so as to improve the degree of freedom in selection of materials for the seal part 24.

Since the frame part 22 can define the region injected with the chip coating material 30, the amount of injection of the chip coating material 30 can be managed stably. After injecting the chip coating material 30 to the inside of the frame part 22, no consideration is needed for the spread of the chip coating material 30, whereby the viscosity of the chip coating material 30 and the like are less likely to be restricted, which improves the degree of freedom in selection of the chip coating material 30.

Since the frame part 22 is provided at the periphery of the semiconductor chip 20, the semiconductor chip 20 can securely be coated with the chip coating material 30 as mentioned above in the structure of the semiconductor device 10. Therefore, a simple structure enables the chip coating material 30 to protect the semiconductor chip 20 more securely. When injected into the frame part 22, the chip coating material 30 can stably cover the semiconductor chip 20, thereby improving the manufacturing yield of the semiconductor device 10 and, as a result, the mass productivity thereof. Hence the manufacturing cost of the semiconductor device 10 can also be cut down.

Second Embodiment

Figure 4:
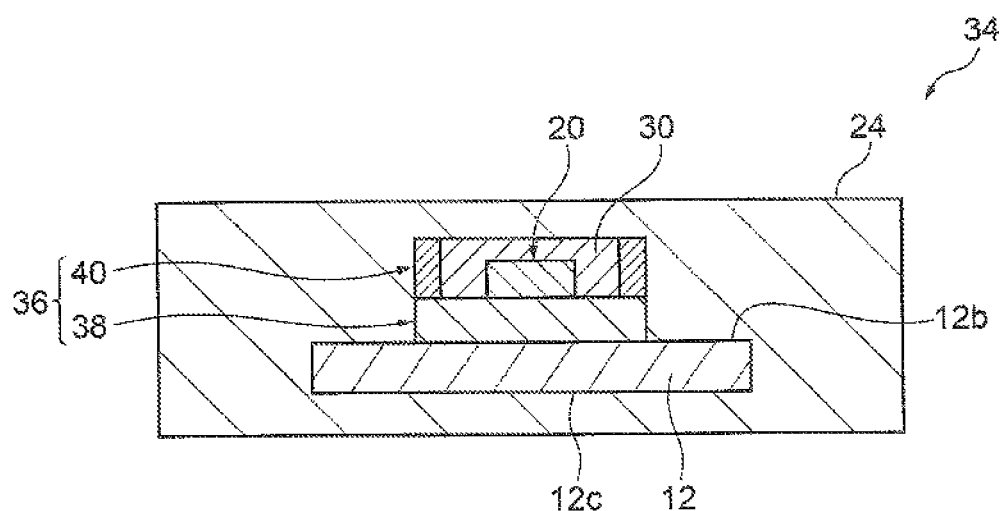
FIG. 4 is a diagram schematically illustrating a cross-sectional structure of the semiconductor device in accordance with another mode.

FIG. 4 is a diagram schematically illustrating a cross-sectional structure of the semiconductor device in accordance with another embodiment. The semiconductor device 34 illustrated in FIG. 4 differs from the structure of the semiconductor device 10 in that it has a chip container 36 for containing the semiconductor chip 20 on the front face 12b of the die pad 12 in place of the frame part 22. The semiconductor device 34 will be explained mainly in terms of this difference.

The chip container 36 has a planar seat part 38 for mounting the semiconductor chip 20 and a frame part 40 as a side wall (or a peripheral wall) for surrounding the periphery of the semiconductor chip 20.

The seat part 38 has a plate form. Examples of materials for the seat part 38 include metals, ceramics, and resins. In one mode, the seat part 38 may be a heat radiation plate (e.g., a heat sink). In the mode in which the seat part 38 is a heat radiation plate, examples of materials for the seat part 38 include metals such as copper and tungsten and ceramics exemplified by aluminum nitride.

The frame part 40 is disposed on the seat part 38 so as to surround the semiconductor chip 20 mounted on the seat part 38. In one mode, the frame part 40 is erected along a peripheral portion of the seat part 38. Examples of materials for the frame part 40 include metals, ceramics, and resins. The materials for the frame part 40 may be identical to or different from those for the seat part 38. The frame part 40 may have the same structure as with the frame part 22. That is, the height (length in the direction normal to the front face 12b) of the frame part 40 is greater than the height (or length) of the semiconductor chip 20. In one mode, the frame part 40 may have such a height that it does not come into contact with the conductor lines 28a, 28b, i.e., a height lower than that of the highest point in loops of the conductor lines 28a, 28b.

The chip container 36 may be produced by firmly fixing the frame part 40 to the seat part 38. The method for firmly fixing the frame part 40 to the seat part 38 may be the same as the method for firmly fixing the frame part 22 to the front face 12b in the semiconductor device 10. The seat part 38 and frame part 40 may be produced integrally with each other when constituted by the same material. For example, the chip container 36 made of a metal may be produced by forming a box-shaped depression on a surface of a metal plate, so that parts corresponding to the bottom wall and side wall of the depression become the seat part 38 and frame part 40, respectively. When the chip container 36 is made of a resin, the seat part 38 and frame part 40 may be shaped integrally with each other.

In the chip container 36, the chip coating material 30 is injected into the inside of the frame part 40, i.e., the space defined by the seat part 38 and frame part 40. The semiconductor chip 20 mounted on the seat part 38 is thus buried in the chip coating material 30.

Since the chip container 36 containing the semiconductor chip 20 is secured to the front face 12b of the die pad 12, the semiconductor chip 20 is mounted on the die pad 12 with the seat part 38 interposed therebetween in the above-mentioned structure.

When the seat part 38 is made of a material including a metal and thus is electrically conductive, the semiconductor chip 20 is electrically connected to the die pad 12 through the seat part 38.

Figure 5A:
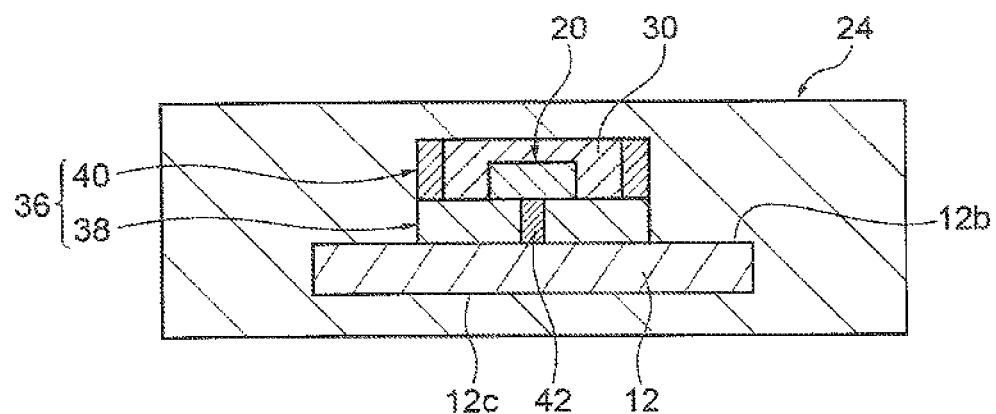
FIG. 5A is a diagram for illustrating an example of electrical connections between a semiconductor chip and a chip mounting substrate in the semiconductor device of the mode depicted in FIG. 4.
Figure 5B:
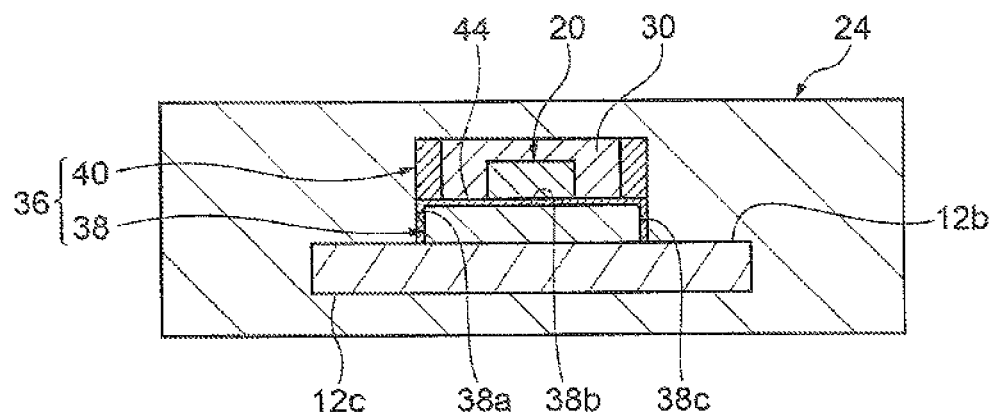
FIG. 5B is a diagram for illustrating another example of electrical connections between the semiconductor chip and the chip mounting substrate in the semiconductor device of the mode depicted in FIG. 4.

When the seat part 38 is made of a material including a ceramic or resin and thus is not electrically conductive, a via hole 42 may be formed in the seat part 38 as illustrated in FIG. 5A in order to connect the semiconductor chip 20 and die pad 12 electrically to each other. Specifically, a through hole extending in the thickness direction of the seat part 38 may be formed, and an electrically conductive material may be injected into the through hole or a layer of the electrically conductive material may be formed on the inner face of the through hole so that both ends of the through hole are electrically connected to each other. Alternatively, as illustrated in FIG. 5B, an electrically conductive layer 44 may be formed on the front face 38b and side faces 38a, 38c of the seat part 38.

The semiconductor device 34 equipped with the chip container 36 can be manufactured as follows, for example. When manufacturing the semiconductor device 34, the semiconductor chip 20 is contained in the chip container 36. For example, the semiconductor chip 20 may be contained in the chip container 36 by firmly fixing the frame part 40 to the seat part 38 after mounting the semiconductor chip 20 on the seat part 38 or by mounting the semiconductor chip 20 on the seat part 38 after producing the chip container 36 by firmly fixing the frame part 40 to the seat part 38.

The chip container 36 containing the semiconductor chip 20 is firmly fixed to the front face 12b of the die pad 12 having the lead 16 integrally joined thereto. It is sufficient for the chip container 36 and die pad 12 to be firmly fixed to each other by a method corresponding to their materials such that they can be joined to each other. Thus firmly fixing the chip container 36 to the front face 12b mounts the semiconductor chip 20 on the front face 12b with the seat part 38 interposed therebetween.

Subsequent steps may be the same as those in the case of the semiconductor device 10. That is, the semiconductor chip 20 is electrically connected to the leads 14, 16 through the conductor lines 28a, 28b. Then, the chip coating material 30 is injected into the inside of the chip container 36, specifically the inside of the frame part 40, and cured. After the chip coating material 30 is cured, the die pad 12 and the chip container 36 containing the semiconductor chip 20 are sealed with the seal part 24.

The semiconductor device 34 equipped with the chip container 36 yields at least the same effects and operations as those of the semiconductor device 10, since the chip container part 36 has the frame part 40. For example, the semiconductor chip 20 is more securely protected by the chip coating material 30 injected into the inside of the frame part 40. This improves the durability of the semiconductor chip 20 and semiconductor device 34.

The chip container 36 containing the semiconductor chip 20 beforehand may be mounted on the die pad 12. This makes it easy to manufacture the semiconductor device 34, while the semiconductor device 34 equipped with the chip container 36 has a structure facilitating its mass production.

The mode in which the seat part 38 is a heat radiation plate improves the heat dissipation of the semiconductor chip 20 when the semiconductor device 34 is in use. When the semiconductor chip 20 utilizes a wide-bandgap semiconductor such as SiC or GaN in particular, the semiconductor device 34 can be used for power devices and the like. In this case, the semiconductor chip 20 having improved heat dissipation is more likely to reduce cracks and the like caused by heat cycles generated by pulsed operations of the semiconductor device 34. This makes it easier to improve the durability of the semiconductor device 34.

Though various modes of the present invention are explained in the foregoing, the present invention is not limited to the modes illustrated above but can be modified within the scope not departing from the gist of the invention.

The die pad 12 is provided with the first lead 16 and second leads 14, 18 by way of example. However, the first lead may be omitted depending on the structure of the semiconductor chip 20. The number of second leads is not limited to 2 but may be 1 or 3 or more.

The number of semiconductor chips 20 provided on the semiconductor device 10, 34 is not limited to 1 but may be 2 or more. When the semiconductor device 10, 34 comprises a plurality of semiconductor chips 20, their types may be different from each other. For example, the semiconductor device 10, 34 may comprise a MOS-FET and a diode as the semiconductor chips 20. While the semiconductor chip 20 is explained as a MOS-FET in the above-mentioned embodiments, it is sufficient for the semiconductor chip 20 other than the MOS-FET to be electrically connected to the die pad 12 and leads 14, 16, 18 so as to be operable. Thus, in the case in which a plurality of semiconductor chips 20 are mounted on the die pad 12, the a plurality of semiconductor chips may be contained in one frame part 22 or one chip container 36, for example.

The second embodiment illustrates a method comprising producing the chip container 36 and then securing the chip container 36 onto the die pad 12. However, the seat part 38 may be secured onto the die pad 12 beforehand.

The frame part 22 and the chip container 36 having the seat part 38 and frame part 40 are explained as examples of the chip container. However, the die pad 12 may be formed with a depression which can contain the semiconductor chip 20, and the depression may be used as a chip container. Various modes illustrated may be combined as appropriate within the scope not departing from the gist of the invention.

What is claimed is:

1. A semiconductor device comprising:
a semiconductor chip;
a chip mounting substrate on which the semiconductor chip is mounted;
a chip container that is provided on the chip mounting substrate and that contains the semiconductor chip; and
an insulating seal part that seals the chip container containing the semiconductor chip and the chip mounting substrate;
wherein the chip container has a frame part surrounding a periphery of the semiconductor chip;
wherein a height of the frame part is greater than that of the semiconductor chip;
wherein the chip container is buried in the insulating seal part; and
wherein the semiconductor chip inside the frame part of the chip container is buried in an insulating chip coating material.

2. The semiconductor device according to claim 1, wherein the chip container is the frame part.

3. The semiconductor device according to claim 2, further comprising:
a first lead integrally joined to the chip mounting substrate and electrically connected to the semiconductor chip; and
a second lead distanced from the chip mounting substrate but secured to the chip mounting substrate by the insulating seal part and electrically connected to the semiconductor chip.

4. The semiconductor device according to claim 1, wherein the chip container has:
a seat part that is secured onto the chip mounting substrate and on which the semiconductor chip is mounted; and
the frame part disposed on the seat part.

5. The semiconductor device according to claim 4, wherein the seat part is a heat radiation plate.

6. The semiconductor device according to claim 5, further comprising:
a first lead integrally joined to the chip mounting substrate and electrically connected to the semiconductor chip; and
a second lead distanced from the chip mounting substrate but secured to the chip mounting substrate by the insulating seal part and electrically connected to the semiconductor chip.

7. The semiconductor device according to claim 4, further comprising:
a first lead integrally joined to the chip mounting substrate and electrically connected to the semiconductor chip; and
a second lead distanced from the chip mounting substrate but secured to the chip mounting substrate by the insulating seal part and electrically connected to the semiconductor chip.

8. The semiconductor device according to claim 1, further comprising:
a first lead integrally joined to the chip mounting substrate and electrically connected to the semiconductor chip; and
a second lead distanced from the chip mounting substrate but secured to the chip mounting substrate by the insulating seal part and electrically connected to the semiconductor chip.

9. The semiconductor device according to claim 1, wherein the chip container has an opening opposite the chip mounting substrate.

* * * * *